(12) United States Patent
Lu et al.

(10) Patent No.: US 9,935,109 B2
(45) Date of Patent: *Apr. 3, 2018

(54) DYNAMIC MEMORY STRUCTURE

(71) Applicant: Etron Technology, Inc., Hsinchu (TW)

(72) Inventors: Nicky Lu, Taipei (TW); Ming-Hong Kuo, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/594,668

(22) Filed: May 15, 2017

(65) Prior Publication Data

US 2017/0250185 A1 Aug. 31, 2017

Related U.S. Application Data

(63) Continuation of application No. 15/181,428, filed on Jun. 14, 2016, now Pat. No. 9,685,449, which is a continuation of application No. 14/746,848, filed on Jun. 23, 2015, now Pat. No. 9,397,103, which is a continuation of application No. 13/527,604, filed on Jun. 20, 2012, now Pat. No. 9,105,506.

(60) Provisional application No. 61/499,186, filed on Jun. 21, 2011.

(51) Int. Cl.
*H01L 27/108* (2006.01)
*H01L 29/423* (2006.01)
*H01L 49/02* (2006.01)

(52) U.S. Cl.
CPC .. *H01L 27/10808* (2013.01); *H01L 27/10826* (2013.01); *H01L 28/60* (2013.01); *H01L 29/42376* (2013.01); *H01L 29/42392* (2013.01)

(58) Field of Classification Search
CPC ......... H01L 27/10808; H01L 27/10826; H01L 28/60; H01L 29/42376; H01L 29/42392
USPC .......... 257/296, 302, 510, 72, 347; 438/283; 365/149, 96
See application file for complete search history.

(56) References Cited

U.S. PATENT DOCUMENTS

| 4,630,088 A | * | 12/1986 | Ogura | ............... H01L 27/10823 257/302 |
| 4,974,060 A | * | 11/1990 | Ogasawara | ....... H01L 27/10841 257/296 |
| 5,627,390 A | * | 5/1997 | Maeda | .................... H01L 21/84 257/302 |
| 5,899,716 A | * | 5/1999 | Tseng | ................ H01L 27/10852 257/E21.648 |

(Continued)

*Primary Examiner* — Mohammed Shamsuzzaman
(74) *Attorney, Agent, or Firm* — Winston Hsu

(57) ABSTRACT

A dynamic memory structure is disclosed. The dynamic memory structure includes: a substrate; a first strip semiconductor material disposed on the substrate and extending along a first direction; a gate standing astride the first strip semiconductor material, extending along a second direction and dividing the first strip semiconductor material into a first source terminal, a first drain terminal and a first channel region; a first dielectric layer sandwiched between the gate and the first strip semiconductor material; a first capacitor unit disposed on the substrate and comprising the first source terminal serving as a bottom electrode, a second dielectric layer covering the first source terminal to serve as a capacitor dielectric layer and a capacitor metal layer covering the second dielectric layer to serve as a top electrode. Preferably, the first source terminal and the first drain terminal have asymmetric shapes.

9 Claims, 5 Drawing Sheets

(56) References Cited

U.S. PATENT DOCUMENTS

| | | | |
|---|---|---|---|
| 6,562,665 B1 | 5/2003 | Yu | |
| 6,649,985 B1 * | 11/2003 | Nishimoto | H01L 27/0811 257/369 |
| 6,960,509 B1 * | 11/2005 | Han | H01L 29/66818 257/E21.285 |
| 7,253,493 B2 * | 8/2007 | Wang | H01L 21/84 257/118 |
| 2003/0193058 A1 | 10/2003 | Fried | |
| 2005/0285149 A1 * | 12/2005 | Chang | H01L 29/42384 257/210 |
| 2006/0189058 A1 * | 8/2006 | Lee | H01L 29/66795 438/198 |
| 2009/0108316 A1 | 4/2009 | Xiong | |
| 2009/0108351 A1 * | 4/2009 | Yang | H01L 27/108 257/347 |
| 2010/0002494 A1 * | 1/2010 | Xiong | H01L 27/10805 365/149 |
| 2010/0032743 A1 * | 2/2010 | Huang | H01L 27/10823 257/306 |
| 2010/0202184 A1 * | 8/2010 | Lee | G11C 7/06 365/96 |
| 2011/0012125 A1 * | 1/2011 | Nicholas | H01L 29/78609 257/72 |
| 2012/0008367 A1 * | 1/2012 | Kajiyama | H01L 27/228 365/148 |
| 2013/0087839 A1 * | 4/2013 | Kuo | H01L 27/10879 257/296 |
| 2013/0270620 A1 * | 10/2013 | Hu | H01L 21/76229 257/296 |

* cited by examiner

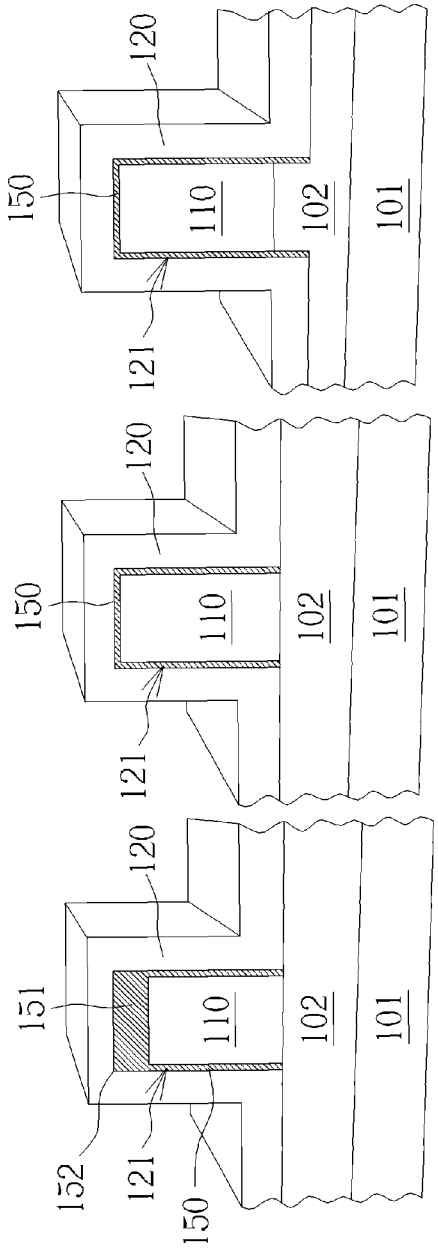
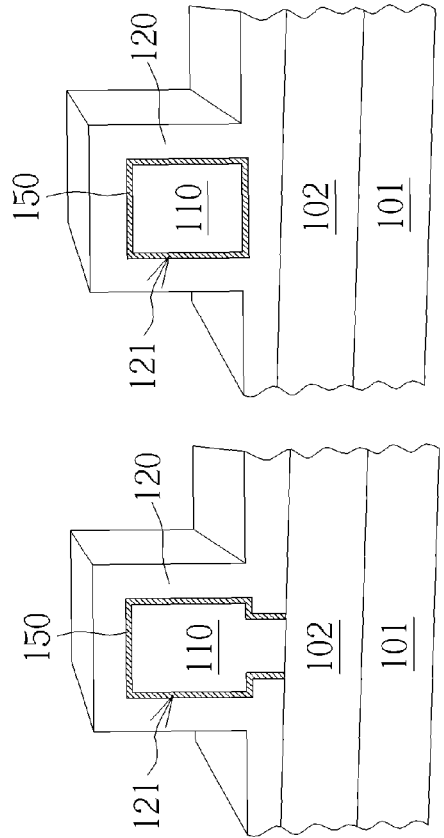

DYNAMIC MEMORY STRUCTURE

CROSS REFERENCE TO RELATED APPLICATIONS

This is a continuation application of U.S. patent application Ser. No. 15/181,428, filed Jun. 14, 2016, which is a continuation application of U.S. patent application Ser. No. 14/746,848, filed Jun. 23, 2015, which is a continuation application of U.S. patent application Ser. No. 13/527,604 (U.S. Pat. No. 9,105,506), filed Jun. 20, 2012, which claims the benefits of U.S. provisional application No. 61/499,186 filed Jun. 21, 2011. The above-mentioned applications are included in their entirety herein by reference.

BACKGROUND OF THE INVENTION

1. Field of the Invention

The present invention generally relates to a dynamic memory structure. In particular, the present invention is directed to a dynamic memory structure of multigates in which the source terminal serves as part of a capacitor unit.

2. Description of the Prior Art

A dynamic memory is a type of memory which is widely used in electronic devices. In general, a dynamic memory contains a source and a drain which are located at both sides of the gate, a gate channel region which is located between the source and the drain, and a capacitor unit for the storage of charges. Traditionally speaking, the gate in a planar dynamic memory is usually disposed above the substrate, but the source and the drain are disposed in the substrate and the gate channel region which is located between the source and the drain is also embedded in the substrate. Moreover, the capacitance unit which is disposed inside or outside the substrate is electrically connected to one of the source and the drain. Such dynamic memory structure encounters bottleneck problems such as too much leak current to further scale down when the process goes to the nano-scale dimension so an ideal component density cannot be desirably achieved.

SUMMARY OF THE INVENTION

In the light of these, the present invention therefore proposes a novel dynamic memory structure. One feature of the novel dynamic memory structure of the present invention resides in that a well-controlled multi-gates component is formed by a gate covering a semiconductor material which bulges from the substrate with a source width of a source terminal larger or equal to a width of a channel region to provide an ideal unit for charge storage. In addition, another feature of the novel dynamic memory structure of the present invention lies in that one of the source terminal or the drain terminal is incorporated into the capacitor unit to become part of the entire capacitor unit so that the component density may be higher.

The dynamic memory structure of the present invention includes a substrate, a first strip semiconductor material, a gate, a first source terminal, a first drain terminal, a first channel region, a first dielectric layer and a first capacitor unit. The first strip semiconductor material is disposed on the substrate and extends along a first direction. The gate stands astride the first strip semiconductor material, extends along a second direction and divides the first strip semiconductor material into a first source terminal, a first drain terminal and a first channel region. Both the first source terminal and the first channel region are at least partially disposed above the surface of the substrate. The source width of the source terminal along the second direction is larger than or equal to the first channel width of the first strip semiconductor material along the second direction. The first dielectric layer is at least partially sandwiched between the gate and the first strip semiconductor material. The first capacitor unit is disposed on the substrate and contains the first source terminal, a second dielectric layer as well as a capacitor metal layer. The first source terminal serves as a bottom electrode. The second dielectric layer which at least partially covers the first source terminal serves as a capacitor dielectric layer. The capacitor metal layer which at least partially covers the second dielectric layer serves as a top electrode.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2A to FIG. 2E illustrate various embodiments of the gate structure of the present invention.

DETAILED DESCRIPTION

The present invention in a first aspect provides a novel 3-dimensional dynamic memory structure. One feature of the novel 3-dimensional dynamic memory structure of the present invention resides in that the source terminal, the drain terminal as well as the channel region together form a T shape or an I shape unit cell structure, to provide an ideal component density. In addition, another feature of the novel dynamic memory structure of the present invention lies in that one of the source terminal or the drain terminal is incorporated into the capacitor unit to become part of the entire capacitor unit so that the component density of the novel 3-dimensional dynamic memory structure of the present invention may be higher.

Figure 1:
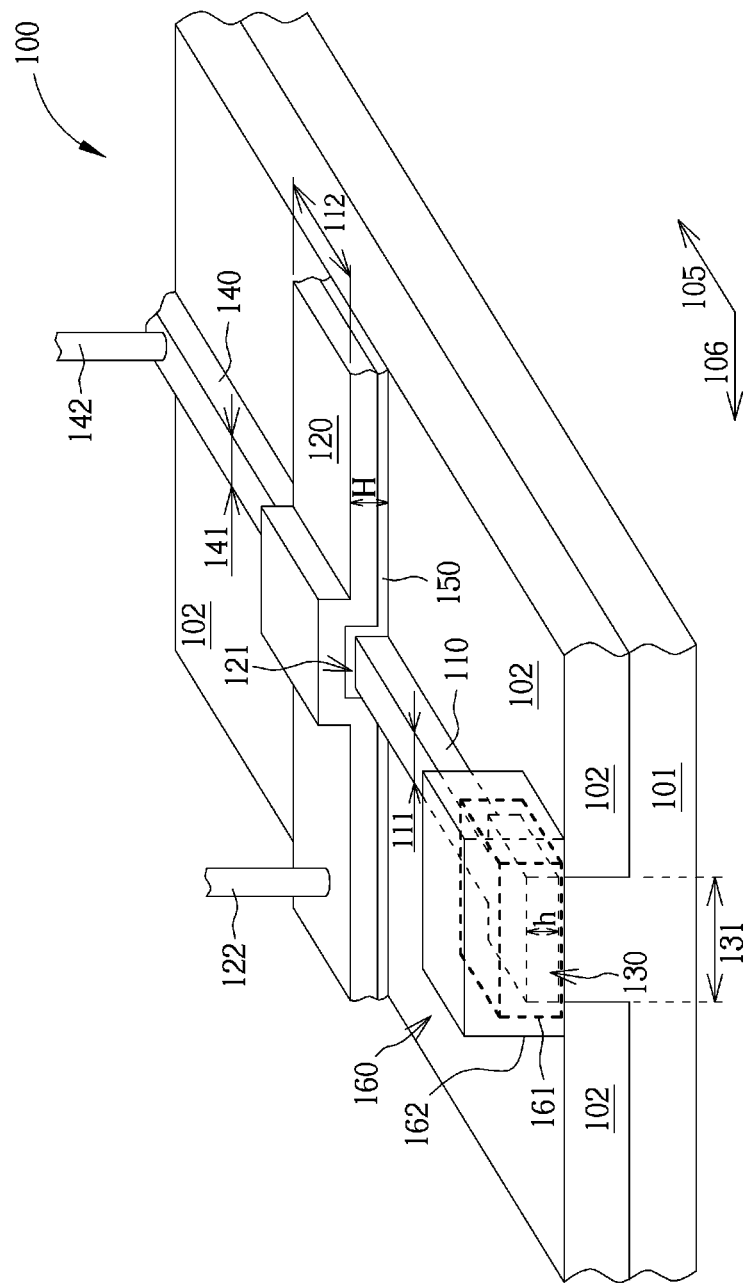
FIG. 1 illustrates a first example of the 3-dimensional dynamic memory structure of the present invention.

Please refer to FIG. 1, which illustrates a first example of the 3-dimensional dynamic memory structure of the present invention. In the first example of the present invention, the 3-dimensional dynamic memory structure 100 includes a substrate 101, a first strip semiconductor material 110, a gate 120, a first source terminal 130, a first drain terminal 140, a first channel region 121, a first dielectric layer 150 and a first capacitor unit 160. The gate 120, the first source terminal 130, the first drain terminal 140, the first channel region 121 and the first capacitor unit 160 together become the main parts of the 3-dimensional dynamic memory structure 100. In the first example of the present invention, the first source terminal 130 and the first drain terminal 140 may have asymmetric shapes. For example, the first source terminal 130, the first channel region 121 and the first strip semiconductor material 110 of the first drain terminal 140 together form a T shape.

The substrate may be a conductive Si substrate 101 such as Si-containing substrate, III-V group on silicon (GaN-on-silicon for instance), graphene-on-silicon or silicon-on-insulator (SOI). The first strip semiconductor material 110 is at least partially disposed above the substrate 101 and extends along a first direction 105. Besides, an insulating material 102 such as a shallow trench isolation (STI) is at least disposed to surround the first strip semiconductor material 110 or to be between each first strip semiconductor material 110. The first strip semiconductor material 110 may include Si material, such as single crystal Si, and be obtained by etching or epitaxial. Because the substrate may be a conductive Si substrate 101 or an insulating Si substrate 102 or the combination thereof, the first strip semiconductor material 110 may be electrically connected to the substrate 101 or electrically insulated to the substrate 102. In FIG. 1 of the first example of the 3-dimensional dynamic memory structure of the present invention, the substrate 101 is a bulk of Si substrate so the first strip semiconductor material 110 may be electrically connected to the substrate 101.

On the other hand, the gate 120 stands astride the first strip semiconductor material 110 and extends along a second direction 106 to divide the first strip semiconductor material 110 into a first source terminal 130, a first drain terminal 140 and a first channel region 121. As shown in FIG. 1, preferably the gate 120's height dimension H vertical to the surface of the substrate 101 of and the first source terminal 130's height dimension h vertical to the surface of the substrate 101 both are approximately the same. In another embodiment of the present invention, the first direction 105 is substantially perpendicular to the second direction 106, or alternatively the first direction 105 crosses the second direction 106 but the first direction 105 is substantially not perpendicular to the second direction 106.

The gate 120 of the present invention may include a conductive material such as poly-Si, silicide or a metal, and stand astride the first strip semiconductor material 110 together with the first dielectric layer 150 to form a gate structure. The gate 120 of the present invention may have various embodiments. FIG. 2A to FIG. 2E illustrate various embodiments of the gate structure of the present invention. For example, FIG. 2A illustrates the first strip semiconductor material 110 together with the gate 120 form a fin field-effect transistor (FinFET), and part of the first dielectric layer 150 may be a thicker first dielectric region 151 to reduce the stress or the electric field around the corner region 152. FIG. 2B illustrates the first strip semiconductor material 110 together with the gate 120 forma tri-gate transistor. FIG. 2C illustrates the first strip semiconductor material 110 together with the gate 120 form a π-gate transistor. FIG. 2E illustrates the first strip semiconductor material 110 together with the gate 120 form an Ω-fin field-effect transistor. FIG. 2E illustrates the first strip semiconductor material 110 together with the gate 120 form a gate-all-around (GAA) transistor.

The gate 120 is located on the surface of the substrate 101 and may stand astride the first strip semiconductor material 110 in various ways. For example, as shown in FIG. 1, in one embodiment of the present invention, the gate 120 may have a curve line to conformally stand astride the first strip semiconductor material 110. Or alternatively in another embodiment of the present invention, the gate 120 may have a straight line to flatly stand astride the first strip semiconductor material 110.

In one preferred embodiment of the present invention, the gate 120 may surround at least three sides of the first strip semiconductor material 110, as shown in FIG. 1, so the on/off state of the first channel region 121 may be well controlled. The "on" state may provide sufficient electric current to result in a correct storage signal, and the "off" state may reduce the leak current as much as possible to provide longer retention time. The more the gate 120 may surround the first strip semiconductor material 110, the better the gate 120 may stably control the first channel region 121.

On the other hand, in the first channel region 121 which is controlled by the gate 120, the smaller the width of the gate 120 is the better the performance of the device may be but the larger the leak current can be, so the width of the channel region of the first strip semiconductor material 110 should be well adjusted to enhance the control of the gate 120. For example, regarding the first channel region 121 disposed below the gate 120, the length dimension 112 parallel with the first direction 105 is at least twice as large as a width dimension 111 of the gate 120 parallel with the second direction 106. Preferably, the gate 120 may be metallic to be a metal gate.

In another embodiment of the present invention, the dimension of the first source terminal 130 may be larger than both the dimensions of the first drain terminal 140 and of the first channel region 121 so the first source terminal 130 and the first drain terminal 140 may have asymmetric shapes. For example, the source width 131 of the first source terminal 130 along the second direction 106 is larger than the first channel region width 111 of the first strip semiconductor material 110 along the second direction 106, and also larger than the drain width 141 of the first drain terminal 140 along the second direction 106. As a result, the first source terminal 130, the first drain terminal 140 and the first channel region 121 together form a T shape and the first source terminal 130 is the larger terminal in dimension.

The first dielectric layer 150 is at least partially sandwiched between the gate 120 and the first strip semiconductor material 110, to become a gate dielectric layer of the gate 120 to control the first channel region 121. Or alternatively as shown in FIG. 1, the first dielectric layer 150 covers the top side and both two opposite sides of the first strip semiconductor material 110. Preferably, the first dielectric layer 150 has a high k material with a dielectric constant larger than that of silicon oxide, such as hafnium oxide, ($HfO_2$), hafnium silicon oxide, ($HfSiO_4$), hafnium silicon oxynitride, (HfSiON), aluminum oxide, ($Al_2O_3$), lanthanum oxide, ($La_2O_3$), tantalum oxide, ($Ta_2O_5$) or the combination thereof. FIG. 2A illustrates a fin field-effect transistor (FinFET), in which a first dielectric region 151 on the top side of the first strip semiconductor material 110 is thicker than the two opposite sides of the first dielectric layer 150 of the first strip semiconductor material 110 to consequently reduce the stress or the electric field around the corner region 152 of the first strip semiconductor material 110.

In addition, the first capacitor unit 160 of the 3-dimensional dynamic memory structure 100 of the present invention is disposed on the substrate 101/102 together with the first source terminal 130, and the first source terminal 130 is part of the first capacitor unit 160. For example, the first capacitor unit 160 may include the first source terminal 130, a second dielectric layer 161 as well as a capacitor metal layer 162 so that first capacitor unit 160 may has at least 5 pF capacitance. First, the first source terminal 130 may serve as the bottom electrode of the first capacitor unit 160. Second, the second dielectric layer 161 at least partially covers the first source terminal 130 to serve as the capacitor dielectric layer of the first capacitor unit 160. For example, the second dielectric layer 161 covers at least one side of the first source terminal 130, or the second dielectric layer 161 covers two sides, three sides, four sides or up to five sides of the first source terminal 130.

Third, the capacitor metal layer 162 at least partially covers the second dielectric layer 161 to serve as a top electrode of the first capacitor unit 160. For example, the capacitor metal layer 162 may completely cover the second dielectric layer 161 and the first source terminal 130. In another embodiment of the present invention, both the first dielectric layer 150 and the second dielectric layer 161 may be of the same high k material, preferably made in the same high k material process. Taking the gate-last for high-K last process for example, the first dielectric layer 150 and the gate 120 may be fabricated along with the capacitor metal layer 162 and the second dielectric layer 161 at the same stage. Or, the first dielectric layer 150 and the second dielectric layer 161 may be of different high k materials.

In another embodiment of the present invention, the 3-dimensional dynamic memory structure 100 may further include a bit line and a word line to respectively electrically connect other components in the dynamic memory structure 100. For example, the bit line 142 is electrically connected to the first drain terminal 140 for use in read and write of the signals, and the word line 122 is electrically connected to the gate 120. The operational procedures of the 3-dimensional dynamic memory structure 100 are well known to persons of ordinary skills in the art so the details will not be elaborated.

Figure 3:
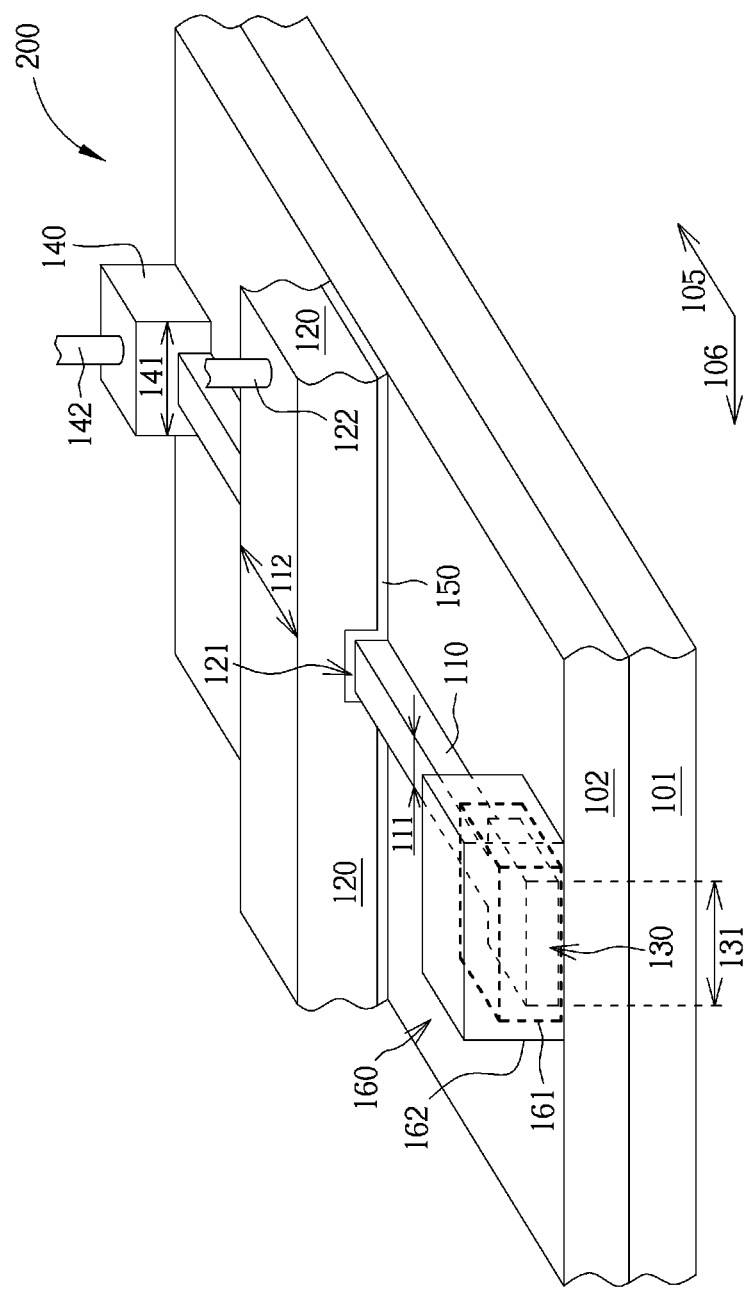
FIG. 3 illustrates another example of the gate standing astride the first strip semiconductor material.

Please refer to FIG. 3, which illustrates a second example of the 3-dimensional dynamic memory structure of the present invention. In the second embodiment of the 3-dimensional dynamic memory structure of the present invention, the 3-dimensional dynamic memory structure 100 includes a substrate 101, a first strip semiconductor material 110, a gate 120, a first source terminal 130, a first drain terminal 140, a first channel region 121, a first dielectric layer 150 and a first capacitor unit 160. The gate 120, the first source terminal 130, the first drain terminal 140, the first channel region 121 and the first capacitor unit 160 together become the main parts of the 3-dimensional dynamic memory structure 100. The major distinctions between the first example and the second example of the present invention reside in the relative differences between drain width 141 and the first channel region width 111.

In the second example of the 3-dimensional dynamic memory structure of the present invention, both the dimension of the first source terminal 130 and the dimension of the first drain terminal 140 may be larger than the dimension of the first channel region 121. For example, the source width 131 of the first source terminal 130 along the second direction 106 is larger than the first channel region width 111 of the first strip semiconductor material 110 along the second direction 106, and the drain width 141 of the first drain terminal 140 along the second direction 106 is also larger than the first channel region width 111 of the first strip semiconductor material 110 along the second direction 106, preferably the source width 131 and the drain width 141 may be similar or the same. As a result, an I shape structure is integrally formed by the first source terminal 130, the first drain terminal 140 and the first channel region 121 all together, and both the first source terminal 130 and the first drain terminal 140 are the larger terminals in dimension.

Similarly, the gate 120 may stand astride the first strip semiconductor material 110 in various ways. FIG. 1 and FIG. 3 show the gate 120 stands astride the first strip semiconductor material 110 in various ways. For example, please refer to FIG. 1. In one embodiment of the present invention, the gate 120 may have a curve line to conformally stand astride the first strip semiconductor material 110. Or alternatively in another embodiment of the present invention as shown FIG. 3, the gate 120 may have a straight line to flatly stand astride the first strip semiconductor material 110. Other descriptions for the second example of the present invention please refer to the above first example so the details will not be elaborated again.

In a third example of the present invention, multiple strip semiconductor materials and gates may together form a dynamic memory unit to dramatically increase the channel width as well as the capacitor area. For example, please refer to FIG. 4, the first strip semiconductor material 110, the gate 120 and the first capacitor unit 160 as well as the second strip semiconductor material 115 and the second capacitor unit 160' together become a dynamic memory structure 300. The main distinctions between the third example and the above examples of the present invention reside in the number of the strip semiconductor materials, the shapes of the drain and the shapes of the capacitor metal layer.

In the third example of the present invention, first the second strip semiconductor material 115, which is similar to the above described first strip semiconductor material 110, they both are disposed on the substrate 101 and extends along the first direction 105. The first strip semiconductor material 110 and the second strip semiconductor material 115 may be respectively electrically connected to the substrate 101 or electrically insulated to the substrate 101. The gate 120 stands astride both the first strip semiconductor material 110 as well as the second strip semiconductor material 115 and divides the first strip semiconductor material 110 into the first source terminal 130, the first drain terminal 140 and the first channel region 121, and also simultaneously divides the second strip semiconductor material 115 into a second source terminal 135, a second drain terminal 143 and a second channel region 123. At the same time, the first dielectric layer 150 is at least partially sandwiched between the gate 120 and the first strip semiconductor material 110, as well as sandwiched between the gate 120 and the second strip semiconductor material 115.

The first source terminal 130 which is disposed on the substrate 101 may serve as the bottom electrode of the first capacitor unit 160. Second, the second dielectric layer 161 at least partially covers the first source terminal 130 to serve as the capacitor dielectric layer of the first capacitor unit 160. In addition, the capacitor metal layer 162 at least partially covers the second dielectric layer 161 to serve as a top electrode of the first capacitor unit 160.

Similarly, the second capacitor unit 160' may include a second source terminal 135, a second dielectric layer 163 as well as the capacitor metal layer 162. The second source terminal 135 which is disposed on the substrate 101 may serve as the bottom electrode of the second capacitor unit 160'. The second dielectric layer 163 at least partially covers the second source terminal 135 to serve as the capacitor dielectric layer of the second capacitor unit 160'. In addition, the first capacitor unit 160 and the second capacitor unit 160' together share the capacitor metal layer 162 so that the capacitor metal layer 162 at least partially covers the second dielectric layer 163 to serve as a top electrode of the second capacitor unit 160'.

Figure 4:
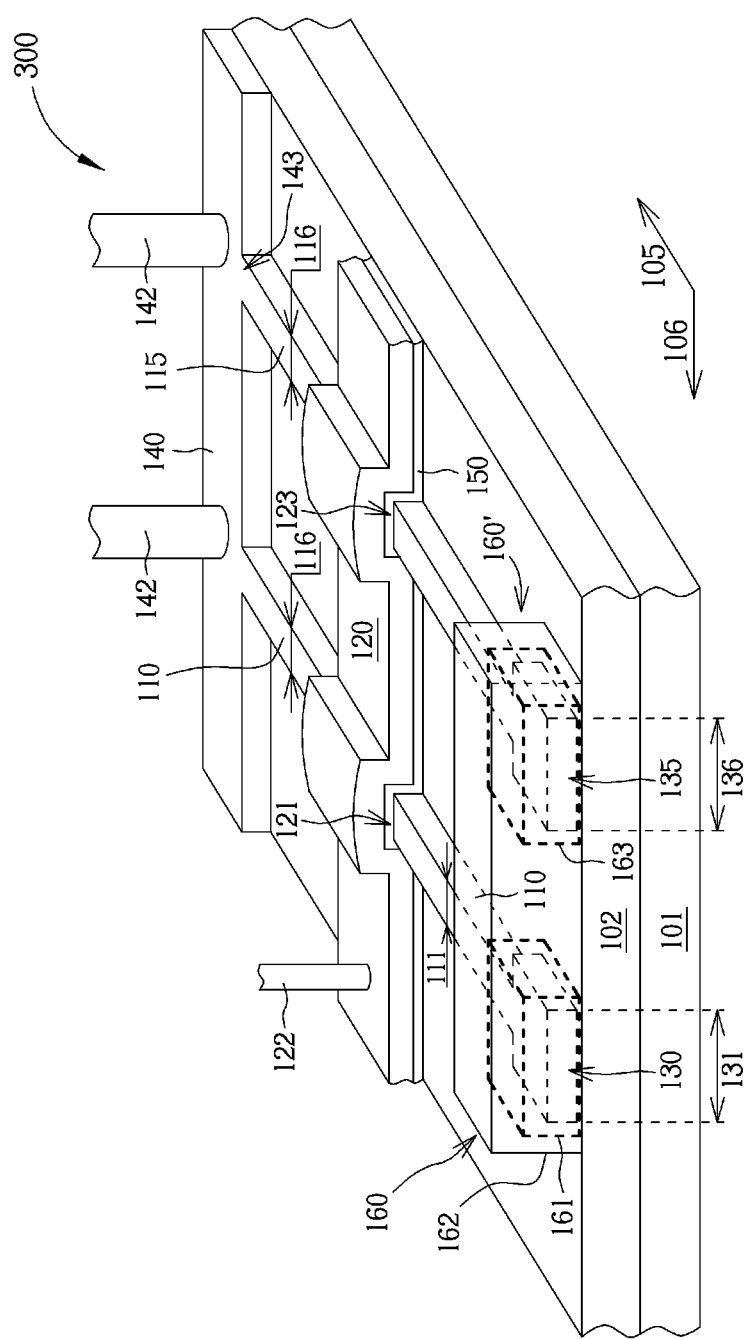
FIG. 4 illustrates another example of the present invention, in which multiple strip semiconductor materials and gates together form a dynamic memory unit to increase the channel width as well as the capacitor area.

As shown in FIG. 4, both the dimension 136 of the second source terminal 135 along the second direction 106 and the dimension of the entire second drain terminal 143 along the second direction 106 are larger than the dimension 116 of the second channel region 123 along the second direction 106. In one embodiment of the present invention, the first source terminal 130 is not in contact with the second source terminal 135. Preferably, the first drain terminal 140 of the first strip semiconductor material 110 is integrated with the second drain terminal 143 of the second strip semiconductor material 115, to be advantageous in facilitating the process window for forming the drain contacts 142. Other descriptions for the third example of the present invention please refer to the above examples so the details will not be elaborated again.

Figure 5:
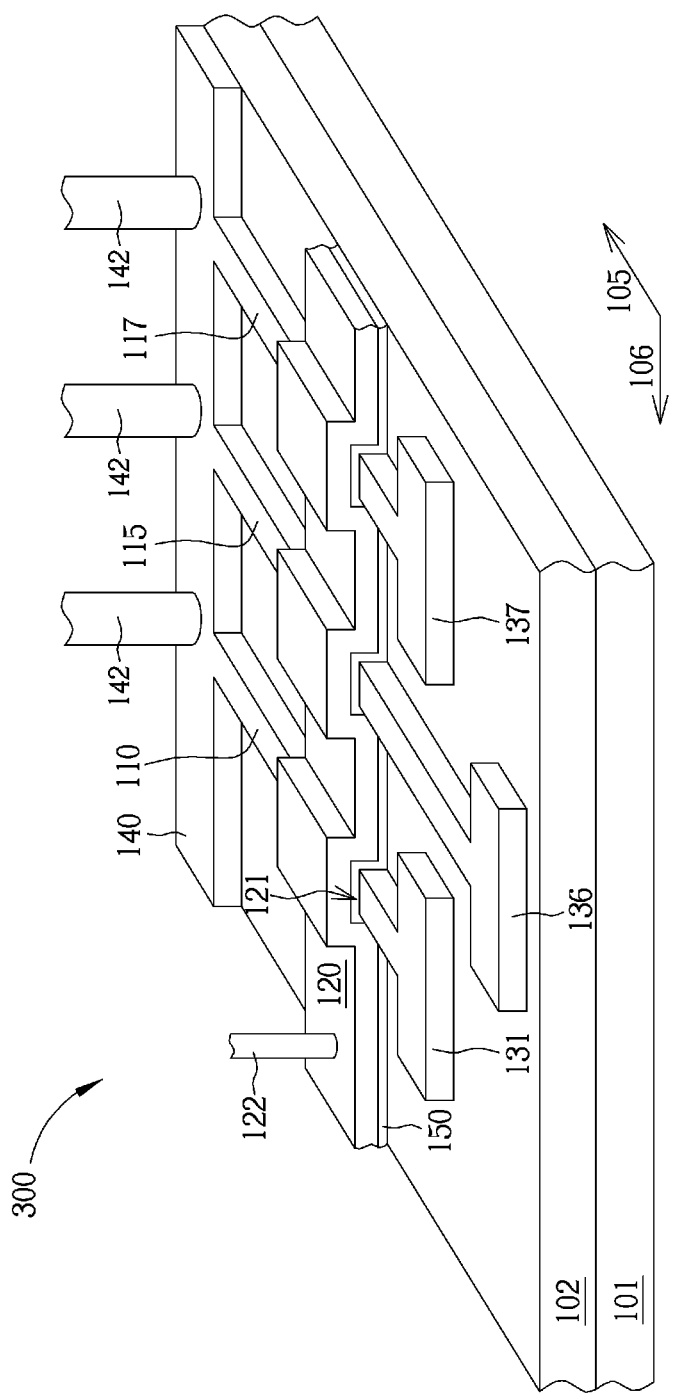
FIG. 5 illustrates another embodiment of the example of the present invention, in which multiple strip semiconductor materials and gates together form a dynamic memory structure of higher capacitance.

Please refer to FIG. 5, in another embodiment of the third example of the present invention, the dynamic memory structure 300 may further include a third strip semiconductor material 117 and a third source terminal 137 for use as a bottom electrode of the second capacitor unit 160' (not shown for the purpose of simplifying the illustrations). The features of the third strip semiconductor material 117 and the third source terminal 137 reside in the first source terminal 130 of the first strip semiconductor material 110, the second source terminal 135 of the second strip semiconductor material 115 and the third strip semiconductor material 117 of the third source terminal 137 are arranged in a staggered arrangement and they all serve as the bottom electrodes of the capacitor units in FIG. 4. Such arrangement is advantageous in increasing the integration density, i.e., component density.

In the third example of the present invention, that multiple strip semiconductor materials and gates together form a dynamic memory structure is advantageous in forming a dynamic memory structure of higher capacitance. For example, the first capacitor unit 160 and the second capacitor unit 160' together may have a higher capacitance up to 20 pF. The present invention may also incorporate two or more strip semiconductor materials and gates together to form a dynamic memory structure, as shown in FIG. 5.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic memory structure, comprising:
   a substrate;
   a first strip semiconductor material disposed on said substrate and extending along a first direction;
   a gate standing astride said first strip semiconductor material according to a shape of said first strip semiconductor material, extending along a second direction and dividing said first strip semiconductor material into a first source terminal, a first drain terminal and a first channel region;
   a first dielectric layer sandwiched between said gate and said first strip semiconductor material, wherein a first thickness of said first dielectric layer on a top surface of said first strip semiconductor material is different from a second thickness of said first dielectric layer on a sidewall of said first strip semiconductor material;
   a first capacitor unit disposed on said substrate and comprising said first source terminal serving as a bottom electrode, a second dielectric layer covering said first source terminal to serve as a capacitor dielectric layer and a capacitor metal layer covering said second dielectric layer to serve as a top electrode; and
   an insulating material disposed adjacently to said first strip semiconductor material, wherein a bottom surface of said insulating material is lower than a bottom surface of said first strip semiconductor material;
   wherein said gate has a curve line to conformally stand astride said first strip semiconductor material.

2. The dynamic memory structure of claim 1, further comprising:
   a second strip semiconductor material disposed on said substrate and extending along said first direction;
   wherein said insulating material is disposed between said first strip semiconductor material and said second strip semiconductor material.

3. The dynamic memory structure of claim 1, wherein said substrate is a conductive Si substrate, an insulating Si substrate or the combination thereof.

4. The dynamic memory structure of claim 1, wherein said first direction is perpendicular to said second direction.

5. The dynamic memory structure of claim 1, wherein said gate is one of a fin field-effect transistor (FinFET), a tri-gate transistor, a π-gate transistor, an Ω-fin field-effect transistor, and a gate-all-around (GAA) transistor.

6. The dynamic memory structure of claim 1, wherein said first dielectric layer and said second dielectric layer both comprise high-k material.

7. The dynamic memory structure of claim 1, wherein said gate surrounds three sides of said first strip semiconductor material.

8. The dynamic memory structure of claim 1, wherein a length dimension of said gate parallel with said first direction is more than or equal to twice as large as a width dimension of said gate parallel with said second direction.

9. The dynamic memory structure of claim 1, wherein said insulating material is disposed along said first direction and adjacently to two sides of said first strip semiconductor material.

* * * * *